United States Patent [19]

Miyatake et al.

[11] Patent Number: 5,363,000
[45] Date of Patent: Nov. 8, 1994

[54] SOLID-STATE IMAGE SENSING APPARATUS

[75] Inventors: Shigehiro Miyatake, Osaka; Kenji Takada, Itami; Kouichi Ishida, Amagasaki; Kouichi Sameshima, Itami, all of Japan

[73] Assignee: Minolta Co., Ltd., Osaka, Japan

[21] Appl. No.: 12,575

[22] Filed: Feb. 3, 1993

[30] Foreign Application Priority Data

Feb. 5, 1992 [JP] Japan ................... 4-019337

[51] Int. Cl.$^5$ .................. H03K 5/01; G06F 7/556
[52] U.S. Cl. .................. 327/350; 327/514; 327/515
[58] Field of Search .............. 307/311, 315, 492, 228, 307/263, 246; 330/257; 323/314, 315, 316, 317; 328/127, 181, 145, 185

[56] References Cited

U.S. PATENT DOCUMENTS

| | | | |
|---|---|---|---|
| 3,240,944 | 3/1966 | Wolfson et al. | 307/311 |
| 4,085,411 | 4/1978 | Genesi . | |
| 4,241,262 | 12/1980 | Audaire et al. | 307/228 |
| 4,384,300 | 5/1983 | Iizuka | 307/291 |
| 4,447,746 | 5/1984 | Fang | 307/311 |
| 4,467,191 | 8/1984 | Chalfin et al. | 307/311 |
| 4,473,836 | 9/1984 | Chamberlain | 357/30 |
| 4,536,702 | 8/1985 | Nagano | 323/314 |
| 4,584,606 | 4/1986 | Nagasaki | 358/209 |
| 4,598,414 | 7/1986 | Dries | 377/58 |
| 4,617,481 | 10/1986 | Masuda | 328/127 |
| 4,742,238 | 5/1988 | Sato | 250/578 |
| 4,742,380 | 5/1988 | Chang | 357/23.4 |
| 4,745,446 | 5/1988 | Cheng | 357/22 |
| 4,769,619 | 9/1988 | Taylor | 323/316 |
| 4,791,396 | 12/1988 | Nishizawa | 357/22 |
| 4,841,349 | 6/1989 | Nakano | 307/311 |
| 4,845,355 | 7/1989 | Nakagawa | 250/211 |
| 4,857,725 | 8/1989 | Goodnough | 307/311 |
| 4,897,614 | 1/1990 | Nishio | 330/257 |
| 4,901,129 | 2/1990 | Hynecek | 357/30 |
| 4,973,833 | 11/1990 | Takada | 250/208.1 |
| 4,990,981 | 2/1991 | Tanaka | 357/23.7 |
| 5,034,625 | 7/1991 | Min | 307/296.2 |
| 5,136,184 | 8/1992 | Deevy | 307/362 |

FOREIGN PATENT DOCUMENTS

253960 1/1989 Japan .

Primary Examiner—Timothy P. Callahan
Assistant Examiner—Shawn Riley
Attorney, Agent, or Firm—Price, Gess & Ubell

[57] ABSTRACT

In an image sensing device, a photodiode is connected to a drain of a MOS transistor. The drain is connected to a gate of the MOS transistor via a resistor. The MOS transistor operates in a subthreshold region to output a signal being logarithmically proportional to the intensity of incident light to the photodiode.

8 Claims, 6 Drawing Sheets

Fig. 1

Prior Art

SOLID-STATE IMAGE SENSING APPARATUS

BACKGROUND OF THE INVENTION

1. Field of the Invention

The present invention relates to a solid-state image sensing apparatus for converting a light signal into an electric signal, and more particularly, to a solid-state image sensing apparatus where the dynamic range is expanded by the incorporation of a logarithmic conversion function. p 2. Description of the Prior Art Solid-state image sensing apparatuses not only are smallsized, light-weight and consume less power but they also are free from image distortion and sticking and have a tolerance for environmental conditions such as vibration and magnetic fields. Since they can be manufactured by a process common or similar to that of large scale integrated circuits (LSIs), they have a high reliability and are suitable for mass production. Because of these advantages, solid-state image sensing apparatuses are widely used. For example, a linear image sensing apparatus is used in a facsimile apparatus and a two-dimensional image sensing apparatus is used in a video camera.

However, most solid-state image sensing apparatuses have defects that a precise control of the exposure amount is required since the dynamic range is small compared to that of the silver film and that even if the exposure amount is precisely controlled, a dark portion of an image is sensed as a black portion, or a bright portion is sensed as a white portion, since the dynamic range is small. As a solution to these problems, a solid-state image sensing apparatus has been proposed having a wide dynamic range and capable of sensing light of from high luminance to low luminance. The solid-state image sensing apparatus is provided with a photosensitive means capable of generating a photoelectric current which is in accordance with the intensity of incident light, a metal oxide semiconductor (MOS) transistor to which the photoelectric current is inputted and a bias means for biasing the MOS transistor so that the bias voltage thereof is equal to or below a threshold voltage and that the subthreshold current can flow therethrough. A characteristic region where the subthreshold current flows is hereinafter referred to as a subthreshold region. The logarithmic compression conversion of the photoelectric current is made by using the MOS transistor in a subthreshold region.

Figure 1:
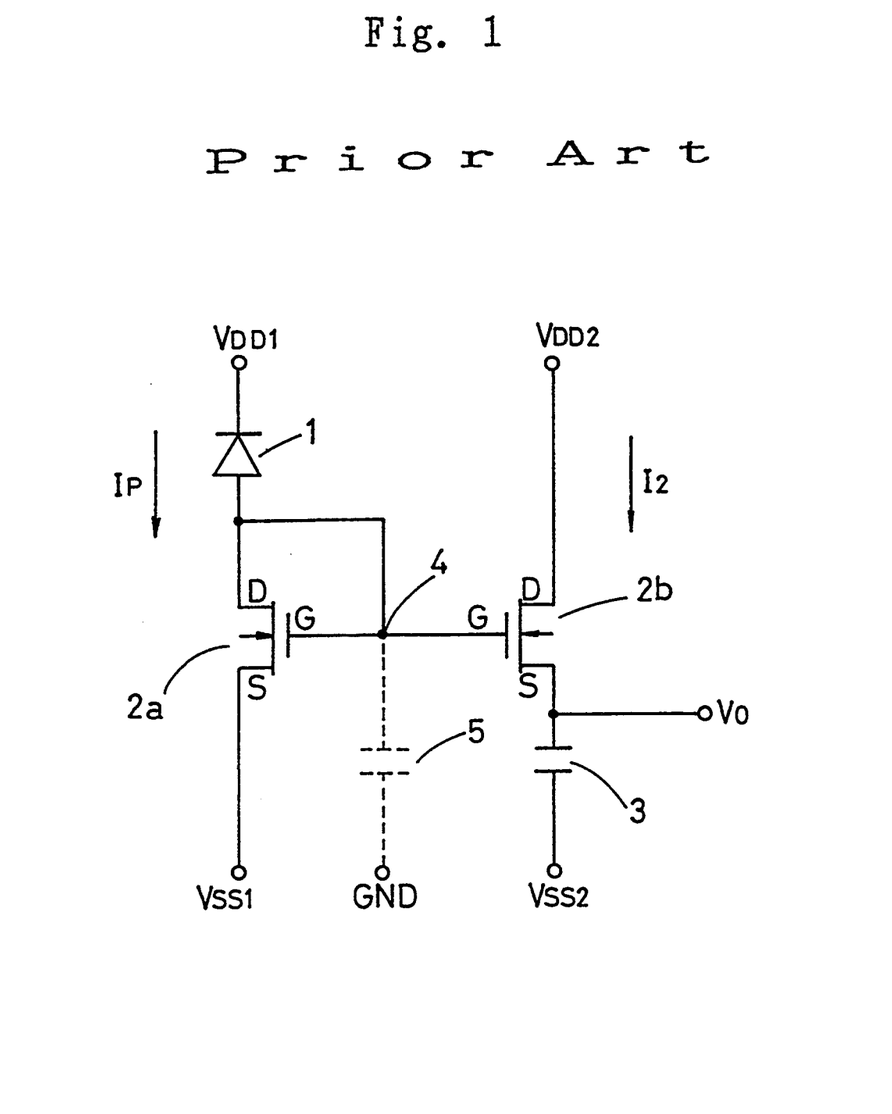
FIG. 1 is a circuit diagram of a conventional solid-state image sensing apparatus.

FIG. 1 shows an arrangement of a circuit corresponding to one pixel of a solid-state image sensing apparatus of Japanese Patent Application H1-334472 of the present applicant.

In this circuit, when $V_O = V_{OI}$ at t=0, if the substrate bias effect is ignored, the following equation (1) is obtained:

$$V_0 = V_{SS1} + \frac{nkT}{q} \ln \left[ \frac{q}{nkTC} \int I_p dt + \exp\left\{ \frac{q}{nkT} (V_{OI} - V_{SS1}) \right\} \right] \quad (1)$$

where:
q is an electron charge;
k is a Boltzman's constant;
T is an absolute temperature;
n is a constant determined by the configurations of MOS transistors 2a and 2b; and
C is a capacitance of a capacitor 3.

The equation (1) indicates that the sum Of an accumulation value of a photoelectric current $I_P$ and a fixed value determined by $V_{OI} - V_{SS1}$ is logarithmically converted into a voltage $V_O$. If $V_{OI} - V_{SS1}$ is sufficiently small, the equation (1) can be re-written as:

$$V_0 = V_{SS1} + \frac{nkT}{q} \ln \left( \frac{q}{nkTC} \int I_p dt \right) \quad (2)$$

Thus, the logarithmic conversion of the sum is precisely made.

As described above, according to the prior art (Japanese Patent Application No. H1-334472), the accumulation value of the photoelectric current $I_P$ is logarithmically converted. That is, even if the intensity of light incident onto a photodiode 1 changes during the accumulation and the photoelectric current $I_P$ changes accordingly, the accumulation value of the photoelectric current $I_P$ is logarithmically converted (in a typical solid-state image sensing apparatus which has no logarithmic conversion function, a signal proportional to the accumulation value of the photoelectric current $I_P$ is obtained). With such a feature, a solid-state image sensing apparatus having a wide dynamic range and capable of sensing light from high luminance to low luminance can be realized.

In the prior art, however, when the intensity of light incident onto the photodiode rapidly changes, the output voltage $V_O$ cannot sufficiently follow the change of the light intensity. This results from the fact that a stray capacitance 5 exists at a node 4 of the MOS transistors 2a and 2b as shown by the dotted lines in FIG. 1. That is, in order to obtain the equation (1) or (2), it is necessary, as described in the specification of the prior art, that a gate voltage $V_G$ of the first and second MOS transistors 2a and 2b change in correspondence with the photoelectric current $I_P$ as indicated by the following equation (3):

$$V_G = V_{SS1} + V_T + \left( \frac{nkT}{q} \ln \frac{I_P}{I_{D0}} \right) \quad (3)$$

where:
$V_T$ is a threshold voltage of the first MOS transistor 2a; and
$D_0$ is a constant determined by the configuration of the first MOS transistor 2a.

Under a stationary state, the gate voltage $V_G$ is determined by the equation (3) and no currents flow through the stray capacitance 5. However, when the photoelectric current $I_P$ changes, a current for the charging or discharging of the stray capacitance 5 flows through the stray capacitance 5. The current becomes 0 when the charging or discharging is completed, and consequently the gate voltage $V_G$ takes a value obtained by the equation (3). For this reason, the change of the gate voltage $V_G$ is delayed (delayed by the period of time required for the charging or discharging of the stray capacitance 5) compared with the change of the photoelectric current $I_P$. Hence, when the photoelectric current $I_P$ changes, the logarithmic conversion based on the equation (1) or (2) is not precisely made.

The delay of the change of the voltage $V_G$ will be described in more detail. First, a case will be described where the photoelectric current $I_P$ decreases due to a decrease of the light intensity. In this case, the charge accumulated in the stray capacitance 5 is discharged, so that the potential of the voltage $V_G$ decreases. This discharging is made by means of a drain current of the first MOS transistor 2a. The drain current decreases as the gate voltage decreases. Therefore, the drain current decreases as the drain voltage, i.e. the gate voltage decreases with the proceeding of the discharging of the charge accumulated in the stray capacitance 5. Because of the drain current decrease, the effect of the discharging deteriorates, thereby increasing the discharging time. For this reason, the capability of the gate voltage $V_G$ to follow the change of the photoelectric current $I_P$ deteriorates.

In a case where the photoelectric current $I_P$ increases due to an increase of the light intensity, the potential of the gate voltage $V_G$ increases as charge is accumulated in the stray capacitance 5. The current required for the charging is supplied by the photodiode 1. However, since the current $I_P$ which flows through the photodiode 1 is divided into a current which flows through the stray capacitance 5 and a current which flows through the first MOS transistor 2a, the effect of the charging deteriorates as the current which flows through the first MOS transistor 2a increases. Since the gate of the first MOS transistor 2a is directly connected to the drain thereof, the gate voltage increases as the drain voltage increases, thereby deteriorating the effect of the charging. For this reason, the capability of the gate voltage $V_G$ to follow the change of the photoelectric current $I_P$ deteriorates.

SUMMARY OF THE INVENTION

An object of the present invention is to provide a solid-state image sensing apparatus where an output voltage excellently follows a rapid change of the light intensity, -the dynamic range is therefore wide and light of from high luminance to low luminance can to a high precision be sensed.

To achieve the above-mentioned object, a solid-state image sensing apparatus of the present invention is provided with: means for generating a photoelectric current proportional to an intensity of incident light; a MOS transistor, connected to the generating means, for outputting a signal being logarithmically proportional to the intensity of incident light to the generating means, said MOS transistor being operated in a subthreshold region; and a passive element for connecting a drain and a gate of the MOS transistor.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Embodiments of the present invention will hereinafter be described with reference to the drawings.

Figure 2:
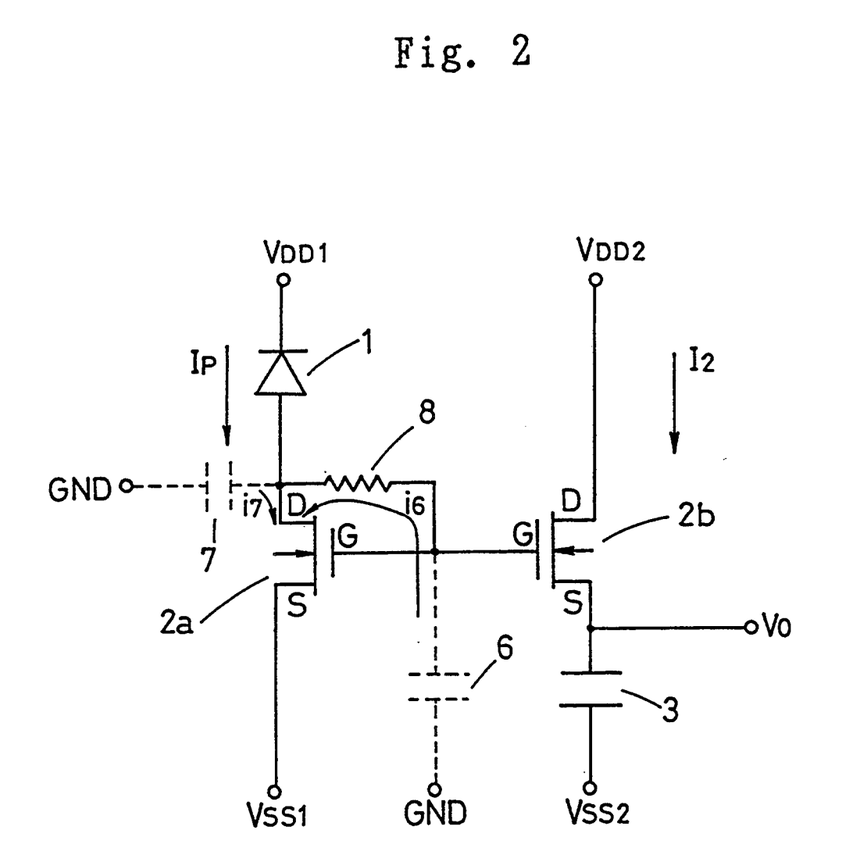
FIG. 2 is a circuit diagram of a first embodiment of a solid-state image sensing apparatus of the present invention.

FIG. 2 shows an arrangement of a circuit corresponding to one pixel of a solid-state image sensing apparatus which is a first embodiment of the present invention. In this circuit, a resistor 8 is inserted between the drain and gate of the first MOS transistor 2a, and the gate of the second MOS transistor 2b is connected to the gate of the first MOS transistor 2a. Stray capacitances 6 and 7 exist at the gate and drain of the first MOS transistor 2a, respectively.

An operation of this circuit in a case where the light intensity rapidly changes will hereinafter be described.

First, a case will be described where the light intensity decreases to decrease the photoelectric current $I_P$. In this case, the charges accumulated in the stray capacitances 6 and 7 are discharged, respectively, so that the gate voltage $V_G$ and the drain voltage $V_D$ of the first MOS transistor 2a decrease. The discharging of the stray capacitance 7 is made by means of the drain current of the first MOS transistor 2a, while the discharging of the stray capacitance 6 is made by means of the resistor 8 and the drain current of the first MOS transistor 2a.

For the above reasons, the drain voltage $V_D$ of the first MOS transistor 2a decreases by a discharging current $i_7$ of the stray capacitance 7 While a discharging current $i_6$ of the stray capacitance 6 is flowing through the resistor 8, the gate voltage $V_G$ is higher than the drain voltage $V_D$. When the discharging current $i_6$ becomes 0, the voltage $V_G$ becomes equal to the voltage $V_D$. In other words, the voltage $V_G$ starts to decrease later than the voltage $V_D$. Since the drain current is larger the higher the gate voltage $V_G$ is, the drain current does not largely decrease with the proceeding of the discharging of the stray capacitance 7. For this reason, the discharging of the stray capacitance 6 through the resistor 8 is also promptly performed.

In a case where the light intensity increases to increase the photoelectric current $I_P$, the voltages $V_G$ and $V_D$ increase by the charging of the stray capacitances 6 and 7. In this case, since the current $I_P$ is divided into a charging current supplied to the stray capacitances 6 and 7 and a drain current which flows through the first MOS transistor 2a, the effect of the charging improves as the current which flows through the first MOS transistor 2a decreases. In this embodiment, since the gate of the first MOS transistor 2a is connected to the drain thereof through the resistor 8, the voltage $V_G$ starts to decrease later than the voltage $V_D$. For this reason, the drain current does not largely increase with the increase of the voltage $V_D$, and consequently the charging effect of the stray capacitance 7 improves. As a result, the charging of the stray capacitance 6 through the resistor 8 is also promptly performed following the charging of the stray capacitance 7.

Figure 3:
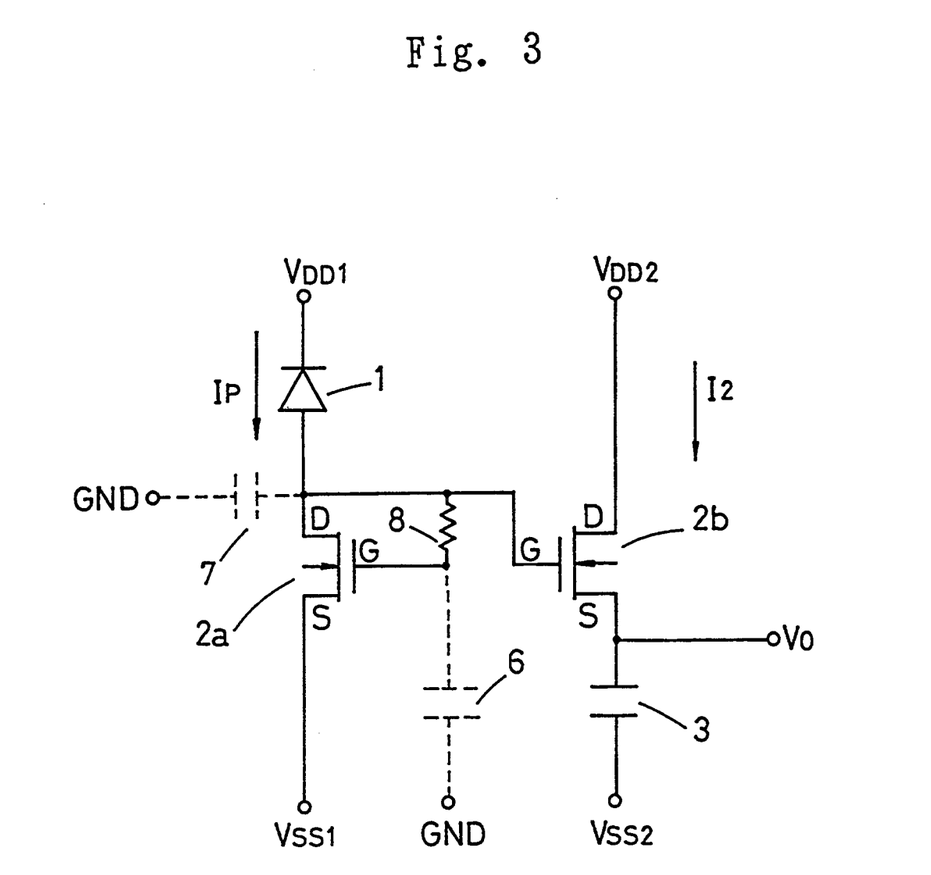
FIG. 3 is a circuit diagram of a second embodiment of a solid-state image sensing apparatus of the present invention.

FIG. 3 shows a second embodiment of the present invention. This embodiment is different from the first embodiment of FIG. 2 only in that the gate of the second MOS transistor 2b is directly connected to the drain of the first MOS transistor 2a and is connected to the gate of the first MOS transistor 2a through the resistor 8. Other portions are the same as those of FIG. 2.

In this embodiment, the drain voltage of the first MOS transistor 2a promptly follows the change of the light intensity similarly to the above-described first embodiment. As a result, the output voltage $V_O$ promptly follows the change of the light intensity.

Figure 4:
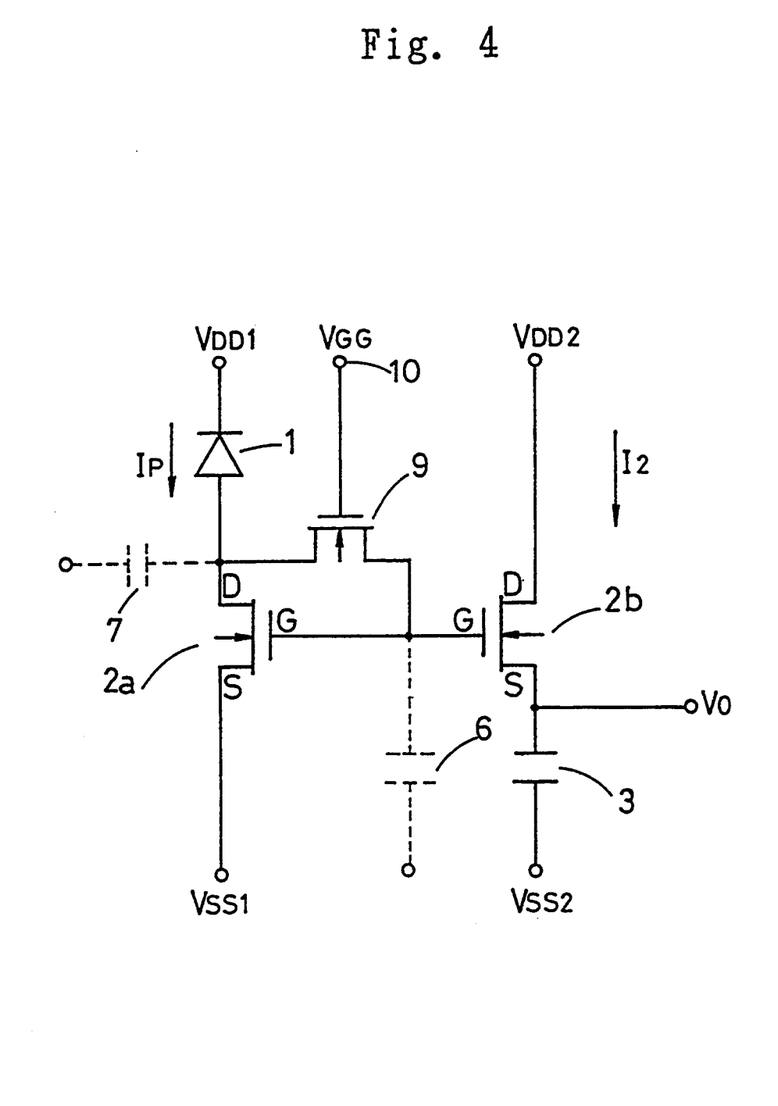
FIG. 4 is a circuit diagram of a third embodiment of a solid-state image sensing apparatus of the present invention.

FIG. 4 shows a third embodiment of the present invention. In this embodiment, the resistor 8 of the first embodiment is replaced by a MOS transistor 9, and a direct current voltage $V_{GG}$ is applied to the gate of the MOS transistor 9 through a terminal 10. The conductivity of the MOS transistor 9 can be controlled by controlling the voltage $V_{GG}$. This indicates that the drain-source of the MOS transistor 9 can equivalently be regarded as a resistor having a value which is in accordance with the voltage $V_{GG}$. Hence, similarly to the first embodiment, the gate voltage of the first MOS transistor 2a promptly follows the change of the light intensity, and consequently the output voltage $V_O$ also promptly follows the change of the light intensity.

Figure 5:
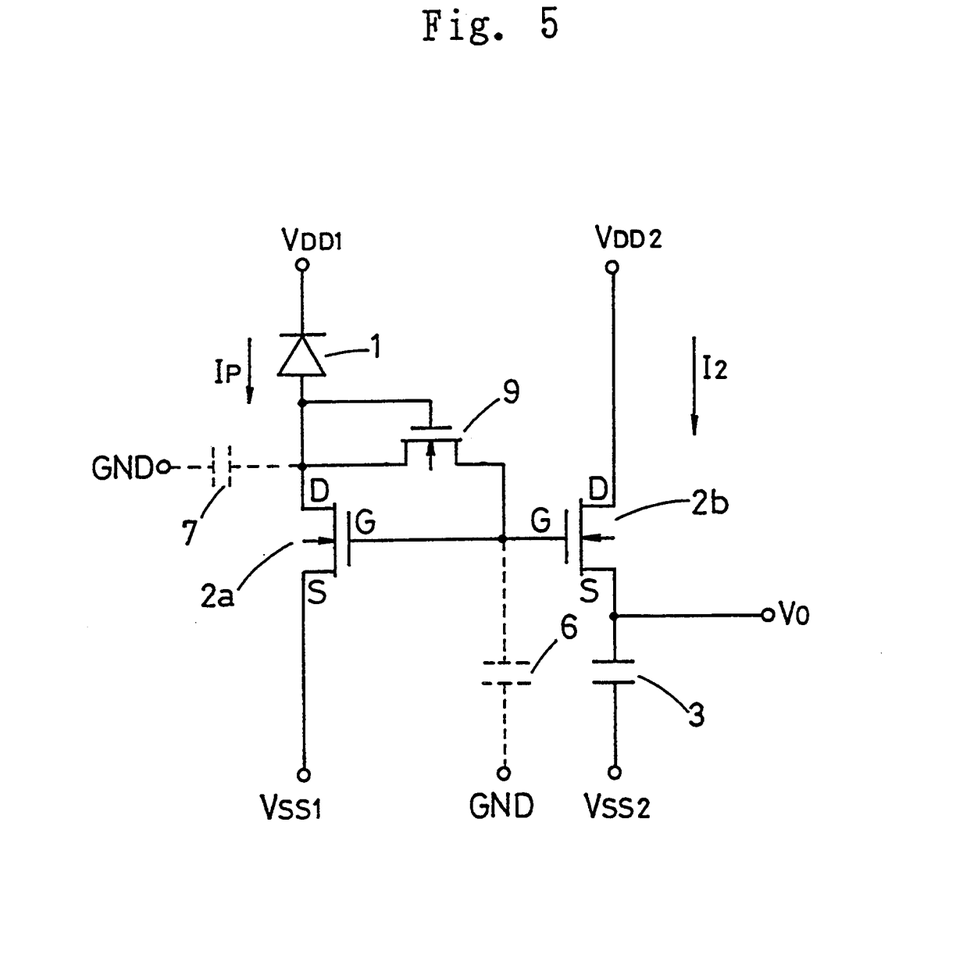
FIG. 5 is a circuit diagram of a fourth embodiment of a solid-state image sensing apparatus of the present invention.
Figure 6:
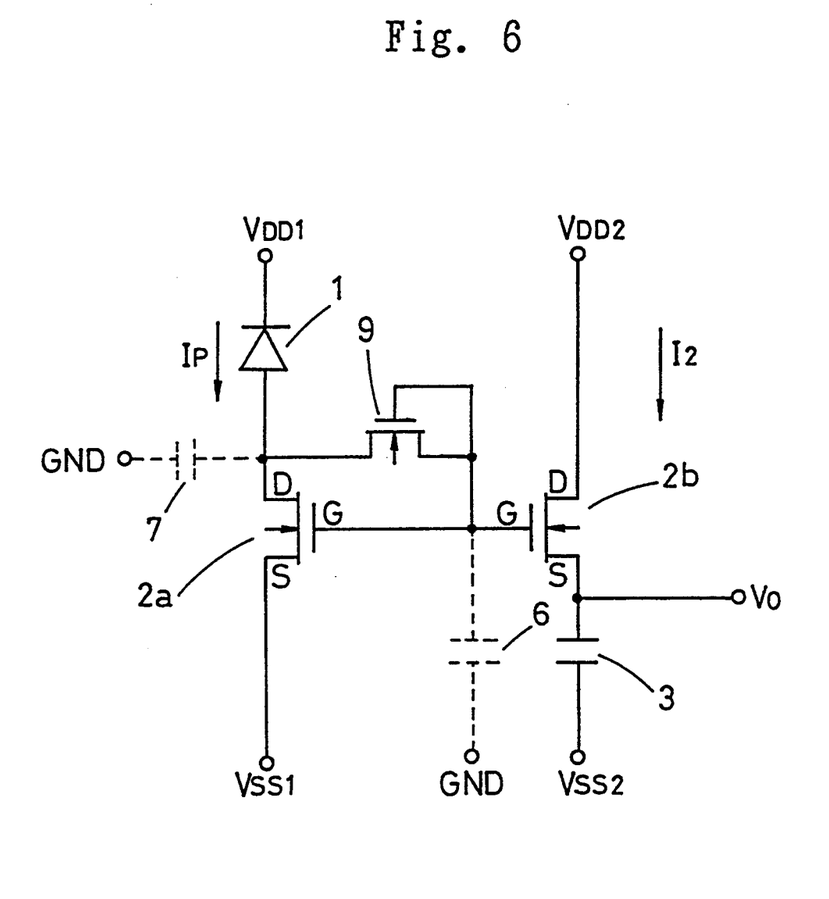
FIG. 6 is a circuit diagram of a fifth embodiment of a solid-state image sensing apparatus of the present invention.

FIGS. 5 and 6 show fourth and fifth embodiments of the present invention, respectively. In these embodiments, the gate of the MOS transistor 9 of the third embodiment is connected to the drain or the source of the MOS transistor 9. By controlling the threshold voltage of the MOS transistor 9 by means of ion implantation, the same result as that of the third embodiment is obtained. Furthermore, these embodiments are advantageous over the third embodiment in that the terminal 10 for receiving the voltage $V_{GG}$ can be omitted.

Since the first and second MOS transistors 2a and 2b operate in the subthreshold region, it is preferable that the MOS transistor 9 also operates in the subthreshold region. In the MOS transistor 9 of the third to fifth embodiments, of the terminal connected to the gate of the first MOS transistor 2a and the terminal connected to the drain of the first MOS transistor 2a as described above, the terminal having a lower potential functions as the source and the terminal having a higher potential functions as the drain. Since the source of the MOS transistor 9 is connected to the drain or the gate of the first MOS transistor 2a, the substrate bias voltage of the MOS transistor 9 is higher than that of the first MOS transistor 2a. For this reason, in order to cause the MOS transistor 9 to operate in the subthreshold region, it is necessary to determine the threshold voltage of the MOS transistor 9 so as to be lower than that of the first MOS transistor 2a. Such a threshold voltage can be realized by the ion implantation of phosphorus into the gate region of the MOS transistor 9.

While n-channel MOS transistors are employed as the first and second MOS transistors 2a and 2b in the above-described embodiments, p-channel MOS transistors may be employed (although it is necessary to change the bias relationship). Moreover, while the gate of the second MOS transistor 2b is connected to the gate of the first MOS transistor 2a in the third to fifth embodiments, it is clear that the same result is obtained even if the gate of the second MOS transistor 2b is connected to the drain of the first MOS transistor 2a.

Obviously, many modifications and variations of the present invention are possible in light of the above teachings. It is therefore to be understood that within the scope of the appended claims, the invention may be practiced other than as specifically described.

What is claimed is:

1. An image sensing device comprising:
    means for generating a photoelectric current proportional to an intensity of incident light;
    a first MOS transistor, connected to the generating means, for outputting a signal which is logarithmically proportional to the intensity of incident light to the generating means, said first MOS transistor is operated in a subthreshold region; and
    an active element, connecting a drain and a gate of the first MOS transistor, for delaying a variation in gate voltage of the first MOS transistor, said voltage variation being brought about by a variation in the photoelectric current
    wherein any stray capacitance existing at the gate of the first MOS transistor is promptly charged or discharged through the active element.

2. An image sensing device as claimed in claim 1, wherein the active element is a second MOS transistor different from the first MOS transistor.

3. An image sensing device as claimed in claim 2, wherein a direct-current voltage is applied to a gate of the second MOS transistor.

4. An image sensing device as claimed in claim 2, wherein a gate of the second MOS transistor is connected to a drain or a source of the second MOS transistor.

5. An image sensing device as claimed in claim 2, wherein the second MOS transistor is operated in a subthreshold region.

6. An image sensing device as claimed in claim 1, further comprising:
    a third MOS transistor being operated in the subthreshold region, and being connected to the gate and the drain of the first MOS transistor with a gate of the third MOS transistor; and
    a capacitor being connected to a source of the third MOS transistor;
    wherein a voltage resulting from a connection between the source of the third MOS transistor and the capacitor is logarithmically proportional to an integrated amount of the photoelectric current.

7. An image sensing device responsive to a rapidly changing light intensity, comprising:
    means for generating a photoelectric current proportional to an intensity of incident light;
    an MOS transistor, having a gate forming an output and a drain, connected to the generating means, for outputting at the output a signal logarithmically proportional to the intensity of incident light to the generating means, the MOS transistor is operated in a subthreshold region;
    means for maintaining the gate voltage at a higher voltage than the drain voltage during any rapid light intensity change, the maintaining means enabling a prompt charging or discharging of any stray capacitance generated by the rapid change in light intensity, the stray capacitance having a voltage at the output;
    circuitry for receiving the voltage from the stray capacitance, the voltage reflecting the prompt charge or discharge of the stray capacitance.

8. An image sensing device responsive to rapidly changing light intensity, comprising:

means for generating a photoelectric current proportional to an intensity of incident light;

a first MOS transistor, having a gate and a drain, connected to the generating means for outputting a signal logarithmically proportional to the intensity of incident light to the generating means, the MOS transistor is operated in a subthreshold region; and means for delaying a variation in gate voltage to enable a prompt charging or discharging of any stray capacitance generated by the rapid change in light intensity, the delaying means comprising:

a second MOS transistor, connected between the gate and drain of the first MOS transistor; and a voltage source applying a voltage to the second MOS transistor of a magnitude to permit the gate voltage of the first MOS transistor to promptly follow any change in intensity of incident light, thereby allowing the second MOS to accurately follow rapid changes in light intensity.

* * * * *